United States Patent [19]

Elliott

[11] Patent Number: 4,831,724

[45] Date of Patent: May 23, 1989

[54] APPARATUS AND METHOD FOR ALIGNING SURFACE MOUNTABLE ELECTRONIC COMPONENTS ON PRINTED CIRCUIT BOARD PADS

[75] Inventor: James N. Elliott, Mission Viejo, Calif.

[73] Assignee: Western Digital Corporation, Irvine, Calif.

[21] Appl. No.: 81,343

[22] Filed: Aug. 4, 1987

[51] Int. Cl.$^4$ .................... H05K 3/39; B23P 19/00
[52] U.S. Cl. .................... 29/840; 29/741; 174/52.4; 228/1.1; 228/56.1; 228/180.2; 357/74
[58] Field of Search .............. 29/846, 840, 741, 827, 29/705; 357/74, 70, 69; 228/180.2, 1.1; 174/52 FP, 68.5

[56] References Cited

U.S. PATENT DOCUMENTS

| | | | |
|---|---|---|---|
| 3,330,026 | 7/1967 | Best et al. | 29/846 |
| 3,373,481 | 3/1968 | Lins et al. | 174/52 FP |
| 3,486,223 | 12/1969 | Butera | 29/840 |
| 3,488,840 | 1/1970 | Hymes et al. | 29/840 X |
| 3,561,107 | 2/1971 | Best et al. | 357/74 X |
| 3,811,186 | 5/1974 | Larnerd et al. | 29/840 |
| 3,871,015 | 3/1975 | Lin et al. | 228/180.2 X |
| 4,277,518 | 7/1981 | Schillke et al. | 427/96 |
| 4,504,008 | 3/1985 | Kent et al. | 228/180.2 |
| 4,545,610 | 10/1985 | Lakritz et al. | 174/68.5 X |
| 4,602,730 | 7/1986 | Murakami et al. | 228/56.1 X |
| 4,614,292 | 9/1986 | Polansky et al. | 228/1.1 |

FOREIGN PATENT DOCUMENTS 60-180664  9/1985  Japan .
WO86/05428  9/1986  PCT Int'l Appl. .

OTHER PUBLICATIONS

*Area Array Solder Interconnections for VLSI*, Solid State Technology, vol. 26, No. 6, Jun. 1983.

Primary Examiner—Carl J. Arbes
Attorney, Agent, or Firm—Spensley Horn Jubas & Lubitz

[57] ABSTRACT

A method and apparatus are described for precisely centering the leads of surface mountable electronic components on the pads of a printed circuit board. The method includes coating the pads with solder, placing the leads of the components on the solder coated pads, melting the solder and vibrating the leads relative to the pads while the solder is molten, so that the surface tension of the molten solder centers the leads on the pads. The molten solder is then cooled until it resolidifies.

12 Claims, 1 Drawing Sheet

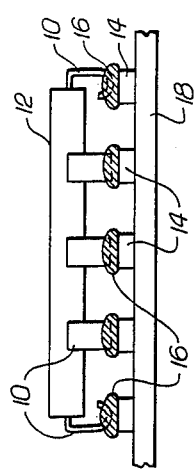
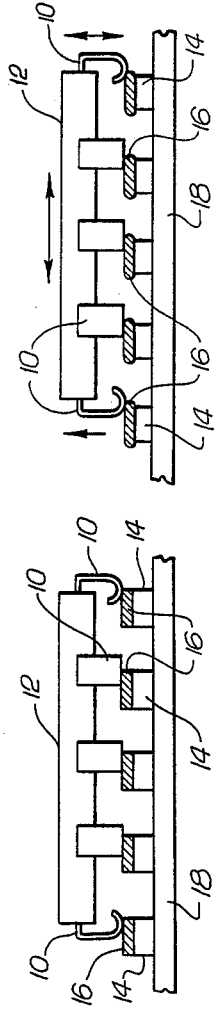
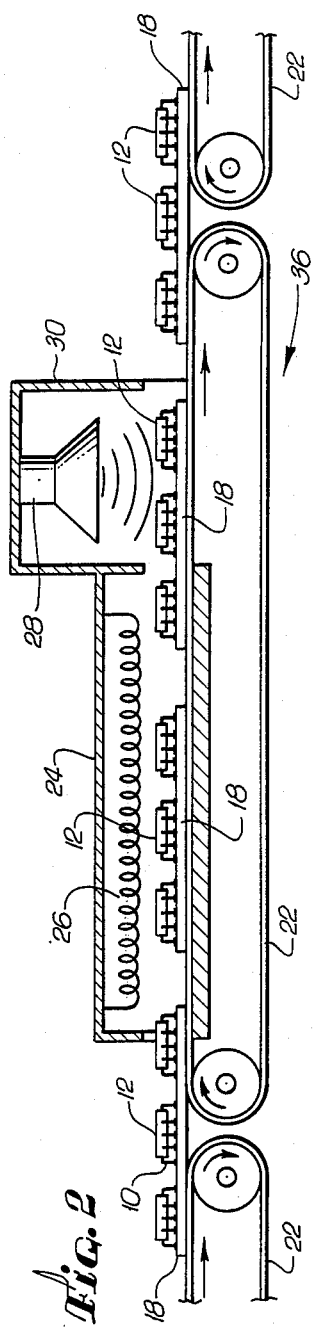
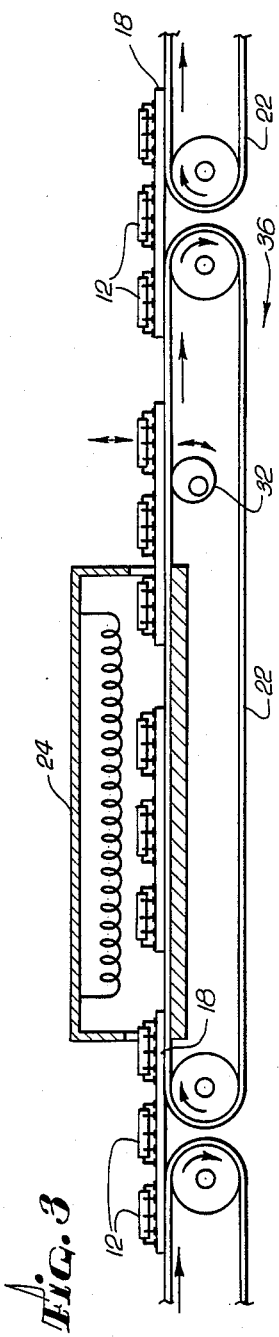

APPARATUS AND METHOD FOR ALIGNING SURFACE MOUNTABLE ELECTRONIC COMPONENTS ON PRINTED CIRCUIT BOARD PADS

BACKGROUND OF THE INVENTION

The present invention relates to the field of electronic device manufacturing, and more particularly to a method and apparatus for precisely positioning the leads of surface mountable electronic components on the pads of a printed circuit board.

When large numbers of electronic devices are manufactured commercially, it is usually not economical to manually solder the individual leads of each electronic component to the corresponding pads of the printed circuit boards. Instead, commercial manufacturers usually use one or more techniques to simultaneously solder the leads of many components to the printed circuit board pads. Such techniques increase the speed and efficiency with which the devices are manufactured, and hence reduce costs.

One such cost saving technique uses surface mountable components. With this technique, the pads of a printed circuit board are covered with solder paste using the well known silk screening process. Solder paste is a finely divided mixture of solder, flux and solvents. The silk screening process coats each pad with a thin layer of solder paste while at the same time leaving the remainder of the board free of the solder paste. Then, the leads of each electronic component are placed on the appropriate solder paste coated pads of the printed circuit board. The printed circuit board, with the electronic components resting on the solder paste coated pads, is then moved into a furnace to melt the solder paste. As the temperature rises, the flux component of the solder paste melts first. The molten flux cleans the surface of the pads and the component leads to any accumulated dirt, oxidation and grease. Further increases in temperature melt the solder component of the solder paste. The molten solder flows over the leads to create an electrical connection between the electronic components and the pads. When the printed circuit board is removed from the furnace, the solder resolidifies, and thereby establishes both an electrical and a mechanical connection between the printed circuit board and the electronic components.

To produce a high quality solder joints between the pads and the leads, it is important to center the leads on the pads so as to produce the greatest area of contact between the pads and the leads. It is also important for esthetic reasons to center the leads on the pads. The pads of a printed circuit board are frequently positioned in straight columns and rows. Thus, if all the component leads are properly centered on the pads, the components will also be positioned neatly in straight columns and rows. After a board is assembled, even slight deviations in the alignment of the various components becomes quite noticeable. Thus, unless the component leads are centered on the pads, the workmanship looks sloppy and a customer may infer that the board is poorly constructed, even if the electrical quality of all the solder connections is actually good.

Electronic device manufacturers have recognized the importance of properly centering electronic components on printed circuit board pads. As a result, the industry has developed electronic component handling devices, called pick and place machines, which can position electronic components on a printed circuit board to within ±0.0005 inch. However, these pick and place machines only form one part of a device assembly line. Thus, as the components are transported along the assembly line from the pick and place machine to the next work station on the assembly line, the boards may be jostled or subjected to vibrations which can knock the components from the center of the pads. To combat this problem, the industry has also developed ultra smooth component conveyor systems to smoothly transport printed circuit boards from the pick and place machine to and through the furnace. However, the precision machining and design required to build such a conveyor increases the cost of these systems.

SUMMARY OF THE INVENTION

The method and apparatus of the present invention precisely aligns the leads of surface mountable electronic components after the components are placed on the printed circuit board pads. This alignment is accomplished while the solder coating on the pads is in the molten phase, for example when the printed circuit board is in the furnace or immediately after it exits the furnace. Thus, the present invention eliminates the need for precisely positioning the electronic components on the pads with high precision pick and place machines. The present invention also eliminates the need for printed circuit board conveyor systems which are specially machined and designed to be ultra smooth and thereby minimize jostling and vibrations while transporting the boards from the pick and place machine to the furnace.

The above-mentioned objects of the present invention are achieved by first depositing the electronic components on the solder paste coated pads of the printed circuit board. The components may be placed on the pads manually or with a pick and place machine. A major portion of the leads should rest on the pads. However, unlike many previously known techniques, the leads need not be positioned to the exacting tolerance of ±0.0005 inch. It is sufficient for the purpose of the present invention that every lead of the electronic components simply rest on the upper surface of each pad.

In the next step of the invention, the solder paste is melted, for example by placing the printed circuit board in a furnace. While the solder is molten, the printed circuit board and electronic components are subjected to vibrations so that the leads of the components vibrate on the solder coated pads of the printed circuit board. During this step, each lead will become precisely centered on its corresponding pad. It is believed that the molten solder provides a lubricating film between the bottom of the leads and the top surface of the pads, thereby allowing the vibrations to slide the components across the surface of the pads. The surface tension of the molten solder coating each pad will pull each lead toward the center of its supporting pad so that each component lead is precisely centered with respect to the pads of the printed circuit board. The exact amplitude and frequency of the vibrations will depend upon the mass of the electronic components being aligned and the size of the printed circuit board. The vibrations must be sufficient to jar each component from its original misaligned position; however, the vibrations should not be so violent that they knock the components entirely off the pads. Thus, in any particular situation, a certain minimal amount of routine experimentation with different amplitudes and frequencies will be required to determine the most effective amplitude and frequency of vibration necessary to properly position the electronic components.

The final step of the present invention simply involves ceasing the vibrations and allowing the solder to resolidify. The resolidified solder will provide both a mechanical and an electrical connection between the printed circuit board and the electronic components. On the resulting board, the leads of each component will be precisely centered on the corresponding pads. Since the leads are centered on the pads, there is a relatively large area of contact. Thus, the resolidified solder will form a good electrical and mechanical connection between the leads and the pads. Furthermore, as previously mentioned, the pads of printed circuit boards are frequently made in columns and rows. With such a board, the present invention provides the additional benefit that the resulting board also has an esthetic appeal because each component will be neatly aligned with all the other components on the board.

The foregoing description of the present invention assumes the typical situation wherein, for each component, all of the pads are symmetrically positioned around the component and each of the pads have a symmetrical shape. In this situation, the present invention will center each lead on its supporting pad. However, in certain circumstances, it may be desirable to position the component leads away from the center of their supporting pads. If the pads are asymmetrically disposed around the component or if the pads have an asymmetrical shape, then the present invention will not necessarily center the component leads on the supporting pads. Instead, the surface tension of the molten solder coating each pad will pull the component leads to the position on the pads wherein the net force of the surface tension pulling on all the leads is zero. One can position the leads at a particular desired location on the pads by arranging the size, shape and location of the pads so that the net force of the surface tension pulling on all the component leads is zero when the leads are in the desired location. The size, shape and location of the pads necessary to achieve the desired positioning of the leads can be determined in advance by calculation or experiment.

BRIEF DESCRIPTION OF THE DRAWINGS

FIG. 1A is a side plan view of a first step in the method of the present invention. This figure shows an integrated circuit resting on the solder paste coated pads of a printed circuit board. The leads are not centered on the pads.

FIG. 1B is a side plan view of a second step in the method of the present invention. The arrows in this figure illustrate the integrated circuit of FIG. 1A vibrating relative to the printed circuit board. In this figure, the solder paste has been melted so that each pad is coated with molten solder.

FIG. 1C illustrates a third step in the method of the present invention. This figure shows the integrated circuit of FIGS. 1A and 1B with its leads precisely centered on the supporting pads. In this figure, the solder has been allowed to resolidify and thus forms both a mechanical and an electrical connection between the integrated circuit and the printed circuit board.

FIG. 2 illustrates one presently preferred apparatus for carrying out the method of FIGS. 1A through 1C using an electric furnace to melt the solder paste and a loudspeaker to provide acoustic waves to vibrate the integrated circuits relative to the printed circuit boards.

FIG. 3 illustrates another presently preferred device for carrying out the process of FIGS. 1A through 1C using an electric furnace and a cam below the conveyor belt. The rotation of the cam against the conveyor belt induces vibrations in the integrated circuits relative to the printed circuit boards.

DETAILED DESCRIPTION OF THE PREFERRED EMBODIMENTS

FIGS. 1A–1C illustrate three steps of one presently preferred embodiment of the present inventive method. The purpose of this particular method is to center the leads 10 of surface mountable electronic components, such as an integrated circuit 12, on the supporting printed circuit board pads 14 while the solder 16 is in a molten condition. In this way, when the solder 16 is allowed to cool, and thus resolidify, a good electrical and mechanical connection will be established between the leads 10 and the pads 14 because a maximum amount of pad 14 and lead 10 surface area will be physically connected with solder 16.

FIG. 1A shows the first step of one presently preferred embodiment of the method of the present invention. Here, a surface mountable integrated circuit 12 is positioned with its leads 10 resting on corresponding pads 14 of a printed circuit board 18. Each pad 14 is coated with solder 16 which is preferably in the form of solder paste. The leads 10 are shown in FIG. 1A slightly misaligned with respect to the center of each pad 14. Such misalignment could result, for example, from a pick and place machine (not shown) inaccurately positioning the integrated circuit 12 on the pads 14. Alternatively, even if the pick and place machine accurately centers the leads 10 of the integrated circuit 12 on the pads 14, subsequent jostling or vibrations, imparted while the board 18 is being transported along the assembly line from the pick and place machine to the furnace 24 (FIGS. 2–3), might knock the integrated circuit 12 from the center of the pads 14.

FIG. 1B shows the next step in the presently preferred embodiment of the inventive method. In this step, the solder paste 16 is melted and, while the solder component of the paste 16 is in the molten phase, the integrated circuit 12 is vibrated with respect to the pads 14. The arrows in FIG. 1B indicate these vibrations. During this step, the integrated circuit 12 will move on the pads 14 to a position wherein the leads 10 are centered with respect to the pads 12. As previously explained, it is believed that the molten solder 16 provides a lubricating film between the leads 10 and the pads 14. The vibrations jar the leads 10 loose from their resting position. Then, the surface tension of the molten solder 16 pulls the leads 10 into the center of each pad 14. The vibrations do not necessarily have to be in the vertical and horizontal direction, as shown in FIG. 1B. The amplitude, direction and frequency of the vibrations which are most effective at centering the leads will depend on the mass and type of electronic components being centered. The vibrations must be powerful enough to jar the leads 10 loose from their uncentered resting positions. However, the vibrations must not be such as to knock the components off of the pads 14.

FIG. 1C illustrates the final step of the presently preferred embodiment of the inventive method. After the surface tension of the molten solder and vibrations center each lead 10, the vibrations are stopped and the solder 16 is allowed to resolidify. As a result, every lead 10 is electrically and mechanically attached to the center of its supporting pad 14. Since each lead 10 is centered, the quality of the solder connections are high because the solder joints extend across the entire surface of both the leads 10 and the pads 14. Furthermore, because the leads 10 are all precisely centered on the pads 14, each integrated circuit 12 may be precisely aligned with the other components (not shown) on the board 18. This results in the additional esthetic benefit that, when the board 18 is completely assembled, all of the electronic components on the board can be arranged in perfectly aligned rows and columns, assuming, of course, that the pads 14 are positioned on the board 18 to produce such a pattern. This neat arrangement of the components conveys the impression of high quality workmanship.

FIG. 2 illustrates one presently preferred embodiment of an apparatus for conducting the method of the present invention. The figure shows a printed circuit board conveying system 36 comprising a plurality of conveyor belts 22. The belts 22 convey the printed circuit boards 18 in the direction of the arrows from the left side of the figure towards the right side of the figure.

With this embodiment, the electronic components 12 are first positioned on the solder paste coated pads (not shown in FIG. 2) of the printed circuit boards 18 either manually or by a component handling device, such as a pick and place machine. The boards 18 are then transported by the conveyor belts 22 toward an electric furnace 24. When the boards 18 are inside the furnace 24, heat from the electric heating elements 26 of the furnace 24 first melts the flux component of the solder paste. The molten flux chemically cleans any dirt, grease or oxidation from the surface of the leads 10 and the printed circuit board pads. Then, as the temperature of the solder paste increases, the flux vaporizes and the solder component of the solder paste melts. While the solder is in a molten phase, the printed circuit boards are transported along the conveyor belt 22 to a mechanism which vibrates the leads of the integrated circuits 12 on the printed circuit board pads. In the presently preferred embodiment of FIG. 2, this vibrating device comprises a loudspeaker 28 housed within a cabinet 30. The loudspeaker 28 vibrates the air with approximately 100 watts of power in a wide frequency range including 50 Hz. These vibrations are then transmitted through the air and impinge upon the components 12 and the printed circuit boards 18. As previously explained, these vibrations cause the component leads 10 to become centered on the pads.

The electronic component conveyor belts 22 then transport the printed circuit boards 18 away from the furnace 24 and speaker cabinet 30. Once the components are away from the speaker cabinet 30, they cease to vibrate and are exposed to ambient temperature air. The ambient temperature air cools the solder so that it resolidifies to form an electrical and mechanical connection between the printed circuit board 18 and the electronic components 12. The printed circuit board 18 is then conveyed further along the assembly line for subsequent processing.

FIG. 3 illustrates an alternative preferred embodiment of an apparatus for conducting the method of the present invention. This device is somewhat similar to the device of FIG. 2 to the extent that the electronic components 12 are placed on the solder paste coated pads of printed circuit boards 18 and then transported into a furnace 24 to melt the solder paste. However, this embodiment differs from the embodiment of FIG. 2 with respect to the mechanism for vibrating the electronic components 12 relative to the pads of the printed circuit boards 18. In the embodiment of FIG. 3, a rotating eccentric cam 32 is disposed beneath the conveyor belt 22. The cam 32 is configured so that the cam lobe 35 periodically vertically displaces the conveyor belt 22. The shape of the cam 32 and its rotational speed are adjusted to produce vibrations of the proper amplitude and frequency to achieve the desired result of aligning the component leads on the supporting pads. As previously discussed, in any particular instance, the exact amplitude and frequency of the vibrations will be determined empirically depending upon the type of components being positioned on the pads and the size of the printed circuit board. Generally, higher frequency vibrations and more power will be required to properly align larger components and components on larger boards.

Two preferred embodiments of the present invention have been described. Nevertheless, it will be understood that various modifications may be made without departing from the spirit and scope of the invention. For example, many devices capable of vibrating the leads of the electronic components relative to the pads of the printed circuit boards, other than the loudspeaker and cam illustrated in FIGS. 2-3, will be effective to carry out the present invention. Furthermore, the method of the present invention does not require that the printed circuit boards be transported along a conveyor belt. The invention will work equally well if the printed circuit boards remains stationary. Thus, the present invention is not limited to the preferred embodiments described herein.

What is claimed is:

1. A method for positioning the leads of surface mountable electronic components on solder coated pads of a printed circuit board, comprising the steps of:
   resting the leads on the solder coated pads;
   melting the solder;
   vibrating the leads relative to the pads while the solder is in the molten phase, so that the leads move across the pads; and
   cooling the molten solder until the solder solidifies.

2. The method of claim 1, wherein the leads are vibrated relative to the pads at a frequency of approximately 50 Hz.

3. A method for positioning the leads of surface mountable electronic components on solder coated pads of a printed circuit board, comprising the steps of:
   resting the leads on the solder coated pads;
   melting the solder;
   vibrating the leads, pads and solder while the solder is in the molten phase, so as to move the leads relative to the pads; and
   cooling the molten solder until the solder solidifies.

4. An apparatus for positioning the leads of surface mountable electronic components which are resting on solder coated pads of a printed circuit board, the apparatus comprising:
   melting means for melting the solder; and
   vibrating means for vibrating the leads of the electronic components relative to the pads while said solder is molten, so that the leads move across the pads.

5. The apparatus of claim 4, wherein said vibrating means includes a device for vibrating the air and directing the vibrations at the components.

6. The apparatus of claim 4, further comprising:
a conveyor belt for supporting and transporting said printed circuit board, wherein said vibrating means includes a rotating cam abutting said belt so that said belt is vibrated by being periodically displaced by the rotation of the cam and the vibrations of the belt are transmitted through the printed circuit board to the leads and the pads.

7. The apparatus of claim 4, wherein said vibrating means vibrates the leads of the electronic components relative to the printed circuit board pads at a frequency of approximately 50 Hz.

8. The apparatus of claim 5, wherein said air vibrations have a frequency of approximately 50 Hz.

9. The apparatus of claim 6, wherein said cam is rotated at a speed to vibrate the belt at approximately 50 Hz.

10. A system for positioning the leads of surface mountable electronic components, the system comprising:
a printed circuit board having pads;
solder coating the pads of the printed circuit board;
surface mountable electronic components having leads resting on the solder coated pads;
melting means for melting the solder; and
vibrating means for vibrating the leads, pads and solder while said solder is molten so as to move the leads relative to the pads.

11. The device of claim 10, wherein said vibrating means includes a device for vibrating the air and directing the vibrations at the leads, pads and solder.

12. The apparatus of claim 10, further comprising:
a conveyor belt moving said printed circuit board, wherein said vibrating means includes a rotating cam abutting said belt so that said belt is vibrated by being periodcally displaced by the rotation of the cam and the vibrations of the belt are transmitted through the printed circuit board to the leads, pads and solder.

* * * * *